(12) United States Patent
Dickman et al.

(10) Patent No.: US 7,352,208 B2
(45) Date of Patent: Apr. 1, 2008

(54) INTEGRATED CIRCUIT HAVING A PLURALITY OF OUTPUT DRIVERS

(75) Inventors: Rory Dickman, Graz (AT); Michael Pfeiffer, München (DE)

(73) Assignee: Infineon Technologies AG, Munich (DE)

( * ) Notice: Subject to any disclaimer, the term of this patent is extended or adjusted under 35 U.S.C. 154(b) by 26 days.

(21) Appl. No.: 10/877,657

(22) Filed: Jun. 25, 2004

(65) Prior Publication Data

US 2005/0030686 A1    Feb. 10, 2005

(30) Foreign Application Priority Data

Jun. 28, 2003 (DE) ................. 103 29 206

(51) Int. Cl.
*H03K 19/0175* (2006.01)

(52) U.S. Cl. ...................... 326/80; 326/101

(58) Field of Classification Search ............ 326/80, 326/101; 257/207, 665; 323/367
See application file for complete search history.

(56) References Cited

U.S. PATENT DOCUMENTS 5,583,457 A * 12/1996 Horiguchi et al. .......... 326/121
5,726,946 A *  3/1998 Yamagata et al. .......... 365/226
5,808,480 A *  9/1998 Morris ....................... 326/81

* cited by examiner

*Primary Examiner*—Daniel D. Chang
(74) *Attorney, Agent, or Firm*—Patterson & Sheridan, L.L.P.

(57) ABSTRACT

One embodiment of the invention provides an integrated circuit having a plurality of output drivers for driving signals from the integrated circuit and having a plurality of supply terminals to apply a supply voltage to the integrated circuit, the plurality of output drivers being supplied by the supply voltage, wherein the plurality of output drivers have a first output driver group having one or a plurality of the output drivers and a second output driver group having one or a plurality of the output drivers, wherein a first supply line segment is provided to supply the output drivers of the first output driver group, and a second supply line segment is provided to supply the output drivers of the second output driver group, wherein the first supply line segment may be supplied with the supply voltage via a first supply terminal and the second supply line segment may be supplied with the supply voltage via a second supply terminal, wherein the first supply line segment is electrically connected to the second supply line segment via a resistor.

13 Claims, 2 Drawing Sheets

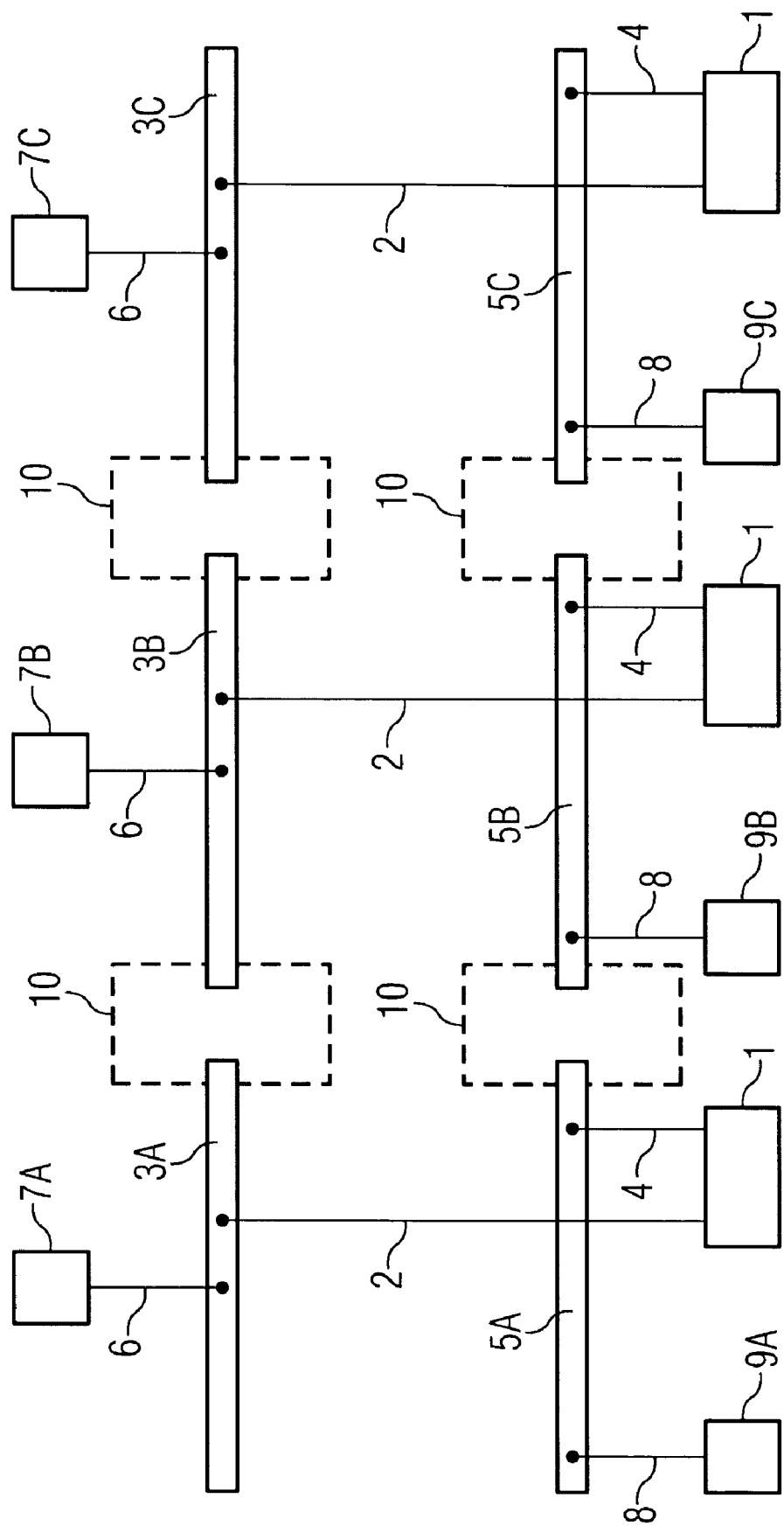

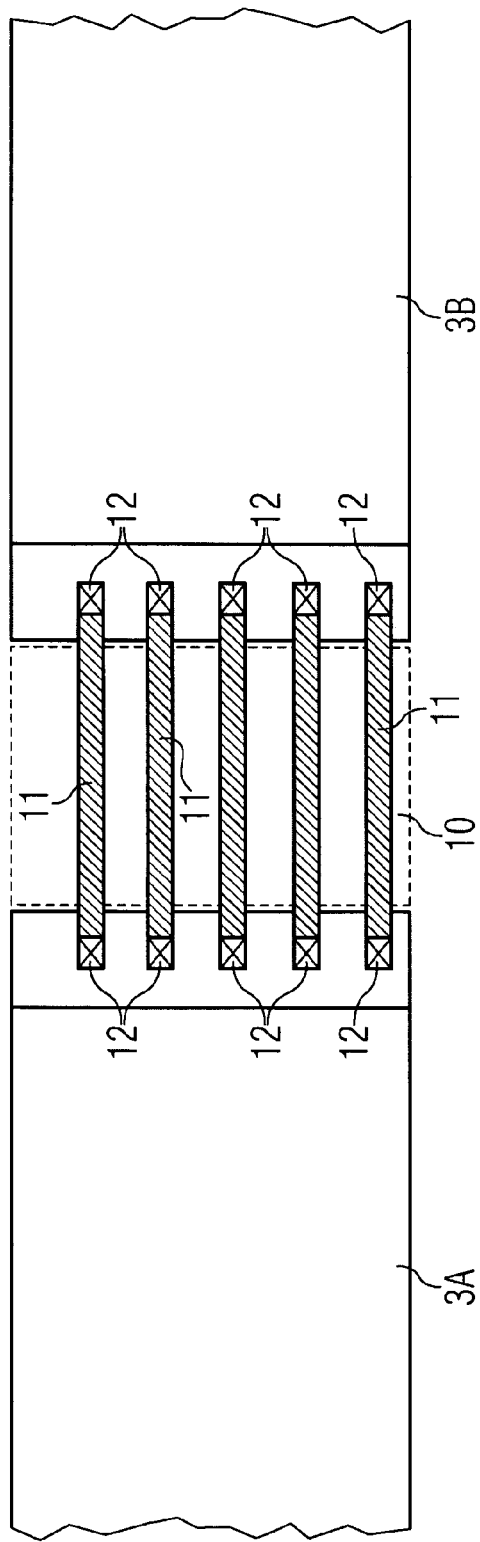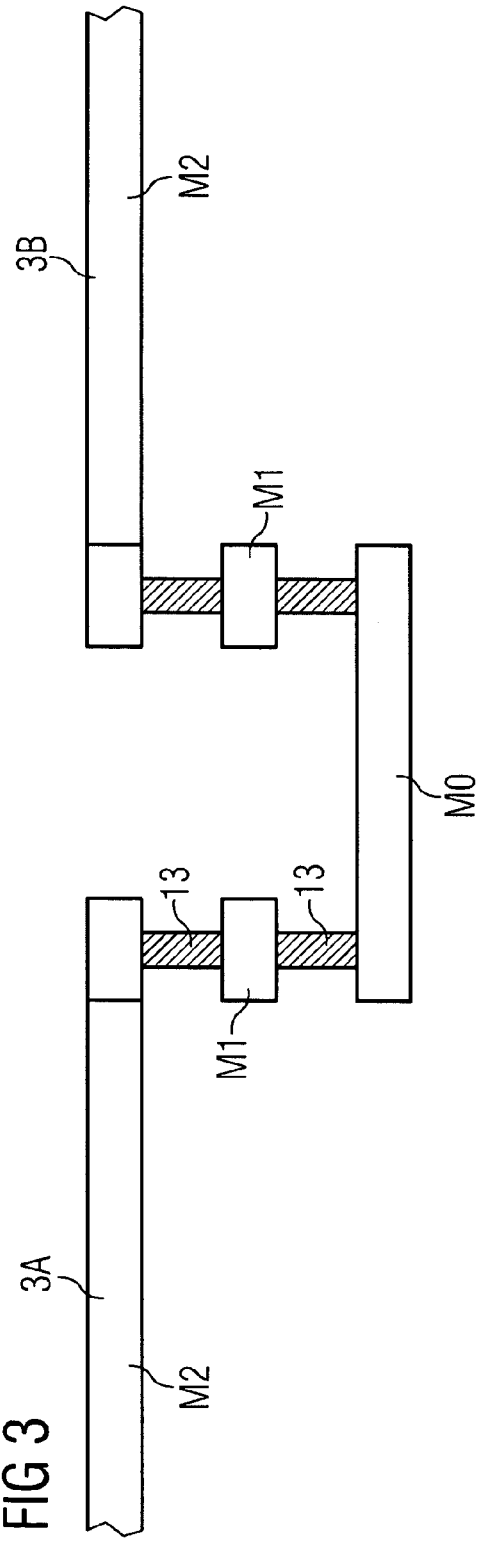

INTEGRATED CIRCUIT HAVING A PLURALITY OF OUTPUT DRIVERS

CROSS-REFERENCE TO RELATED APPLICATIONS

This application claims foreign priority benefits under 35 U.S.C. §119 to co-pending German patent application number 103 29 206.3-33, filed Jun. 28, 2003. This related patent application is herein incorporated by reference in its entirety.

BACKGROUND OF THE INVENTION

1. Field of the Invention

The invention relates to an integrated circuit having a plurality of output drivers which are supplied with a supply voltage via a plurality of supply terminals.

2. Description of the Related Art

Integrated circuits have output drivers to drive internally generated signals toward the outside. Particularly in the case of simultaneously switching output drivers, line disturbances are generated in the form of interference signals, which can have a considerable effect on the signal processing and on other signal lines. The line disturbances are spread in particular by the inductive properties of the interconnects or capacitive coupling effects since adjacent interconnects or interconnects in proximity are thereby influenced. The line disturbances may be taken up for example by the interconnects of the integrated circuit, the housing terminals and their connections, the conductor tracks on the printed circuit board and the like and influence circuits connected thereto. The rapidity of the alternation of currents which flow through the interconnect generates differential voltage fluctuations which influence the signal integrity. These line disturbances may influence the distribution of the supply voltages $V_{DD}$ and $V_{SS}$, inter alia.

In particular, these line disturbances are observed in integrated circuits having simultaneously switching output drivers. In the case of DRAM memory circuits, the supply and ground lines are in each case produced in the form of a simple homogeneous metal interconnect having suitable connecting lines to the respective output driver circuits. DDR-DRAM circuits have, for example, eighteen (18) such connecting line pairs which in each case connect the high supply voltage $V_{DD}$ and ground to the respective output driver.

On account of the length of the supply interconnects, which may amount to as much as half the chip length, line disturbances may be transmitted over the entire length of the interconnects. This may bring about signal disturbances in other regions of the integrated circuit.

RC filters are customarily used to attenuate the line disturbances on the supply voltage lines. However, an RC filter includes a capacitance which requires a comparatively large area in the case of a realization in an integrated circuit. Moreover, the metal interconnect representing the resistance portion of the RC filter may have an excessively large resistance which results in an unmatched RC time constant.

SUMMARY OF THE INVENTION

It is an object of the present invention to provide an integrated circuit which reduces the signal disturbances on the supply voltage lines, particularly in the case of simultaneously switching output drivers.

One embodiment of the invention provides an integrated circuit having a plurality of output drivers for driving signals from the integrated circuit and having a plurality of supply terminals to apply a supply voltage to the integrated circuit. The plurality of output drivers are supplied by the supply voltage and have a first output driver group having one or a plurality of the output drivers and a second output driver group having one or a plurality of the output drivers. A first supply line segment is provided to supply the output drivers of the first output driver group, and a second supply line segment is provided to supply the output drivers of the second output driver group. The first supply line segment may be supplied with the supply voltage via a first supply terminal, and the second supply line segment may be supplied with the supply voltage via a second supply terminal. The first supply line segment may be electrically connected to the second supply line segment via a resistor.

The segmentation of a supply voltage line for the high supply potential or the ground potential makes it possible for the effects of line disturbances on account of switching output drivers in an output driver group to remain restricted to the respective supply line segment, thereby reducing the influence on the output drivers connected to the respective other supply line segment or segments. Consequently, the respective other supply line segments are more independent with respect to interference signals occurring in the supply line segment and are not impaired by line disturbances caused by signal reflections and by output drivers connected to other supply line segments.

The task of the resistor is to represent a line termination for each of the supply line segments, the line termination being unmatched as far as possible with regard to the signal disturbances that occur, thereby achieving reflection of the line disturbances at the respective end of one of the supply line segments. As a result, the line disturbance from one supply line segment is not passed on to an adjacent or further supply line segment.

Furthermore, the resistor has the task of enabling charge equalization between the supply line segments, for the case where a high loading on the supply terminals necessitates support through adjacent supply voltage terminals. For this reason, the resistor should not be chosen with too high a value.

In one embodiment, the first and/or the second supply line segment are embodied in a first (e.g., upper) interconnect plane of the integrated circuit. The resistor may be embodied in a second interconnect plane. Both the first interconnect plane and the second interconnect plane represent metal layers of the integrated circuit. The second interconnect plane may be embodied in an uncovered lower metal layer, so that the value of the resistor can be adapted by means such as a laser trimming process after the production of the second interconnect plane of the integrated circuit.

In another embodiment, the resistor may be chosen with regard to the first and second supply line segment to reflect the interference signal occurring on one of the first and second supply line segments at the resistor, so that the interference signals can be reduced or cannot pass into the other supply line segment coupled via the resistor. This ensures that the line disturbance remains essentially in one supply line segment and, consequently, cannot pass from one supply line segment into another supply line segment. As a result, even when line disturbances occur in two adjacent supply line segments, the effect that can be achieved is that the line disturbances cannot accumulate and do not lead to a considerable impairment of the functionality of the output drivers.

BRIEF DESCRIPTION OF THE DRAWINGS

A preferred embodiment of the invention is explained in more detail below with reference to the accompanying drawing, in which:

FIG. 1 schematically shows a detail from an integrated circuit having a plurality of output drivers;

FIG. 2 shows a plan view of a region in which two adjacent supply line segments are connected to a resistor element; and FIG. 3 shows a cross section through the region illustrated in FIG. 2.

DETAILED DESCRIPTION OF THE PREFERRED EMBODIMENT

FIG. 1 schematically shows a detail from an integrated circuit. The integrated circuit has output drivers (not shown) combined to form output driver blocks 1. Each of the output driver blocks 1 may comprise four output drivers for example. The output driver blocks 1 are connected to a first, second and third supply line segment 3A, 3B, 3C via a respective first connecting line 2 and to a fourth, fifth and sixth supply line segment 5A, 5B, 5C via a second connecting line 4. The first, second and third supply line segments 3A, 3B, 3C and the fourth, fifth and sixth supply line segments 5A, 5B, 5C are respectively adjacent to one another.

Each of the first, second and third supply line segments 3A, 3B, 3C is connected, in each case, via a third connecting line 6 to a respective first supply terminal 7A, 7B, 7C for a high supply voltage potential. Each of the fourth, fifth and sixth supply line segments 5A, 5B, 5C is connected, in each case, via a fourth connecting line 8 to a respective second supply terminal 9A, 9B, 9C for a low supply potential, e.g., a ground potential. Since the supply voltages, i.e., the high and low supply potentials, are in each case applied to the integrated circuit via a plurality of supply terminals 7A, 7B, 7C, 9A, 9B, 9C, a dedicated assigned supply terminal 7A, 7B, 7C, 9A, 9B, 9C, may be provided for each of the supply line segments 3A, 3B, 3C, 5A, 5B, 5C, respectively. In addition to providing the supply voltage for the output driver blocks, the supply line segments 3A, 3B, 3C, 5A, 5B, 5C, may also supply further circuits (not shown) of the integrated circuit with the supply voltages.

Since signals at the output drivers, in particular when outputting data signals, are often output simultaneously at a plurality of the output drivers of one of the output driver blocks 1, the output drivers generally switch simultaneously. Since the current flow through the output drivers is particularly large during the switching of the output drivers, the supply voltage potentials are particularly loaded at the switching instants.

Due to the current flowing during switching, on account of the line resistances of the first and second connecting lines and of the first to sixth supply line segments 3A, 3B, 3C, 5A, 5B, 5C, a voltage is dropped across these, thus giving rise to voltage fluctuations in specific regions of the respective supply voltage segments 3A, 3B, 3C, 5A, 5B, 5C. These voltage fluctuations are undesirable and lead to line disturbances. To prevent the line disturbances that are brought about in this way on the supply line segments 3A, 3B, 3C, 5A, 5B, 5C from having the effect of impairing the functional capability or functionality of each of the output drivers of other output driver blocks 1, the supply line segments 3A, 3B, 3C, 5A, 5B, 5C are, in each case, embodied separately from one another. The first, second and third supply line segments 3A, 3B, 3C and the fourth, fifth and sixth supply line segments 5A, 5B, 5C are respectively connected to one another, for example, by their ends, via resistor elements 10. The resistor elements are, in each case, arranged between the adjacent first, second and third supply line segments 3A, 3B, 3C and between the adjacent fourth, fifth and sixth supply line segments 5A, 5B, 5C. The resistor elements 10 form an electrical connection between the adjacent supply line segments 3A, 3B, 3C, 5A, 5B, 5C with a resistance prescribed by the resistor element 10.

The resistance of the resistor element 10 may be chosen such that, in the case of the line disturbances that customarily occur, the interference signals are reflected at those ends of the supply line segments 3A, 3B, 3C, 5A, 5B, 5C which are connected to the resistor element 10. By way of example, a resistance of 20 Ohms has proved successful in experiments. Such a low resistance of 20 Ohms has the advantage, moreover, that in the event of particular loading on one supply line segment, the charge carriers from an adjacent supply line segment can also flow to the loaded supply line segment to support the loaded supply line segment, thereby reducing the voltage drop on the loaded supply line segment.

FIG. 2 illustrates the plan view of a region of the integrated circuit illustrating two mutually adjacent supply line segments, e.g., the first and the second supply line segment 3A, 3B. The supply line segments 3A, 3B illustrated may be embodied in a first metal layer M2, which has a high conductivity to ensure a relatively low interconnect resistance. The first and the second supply line segments 3A, 3B are connected to one another through the resistor element 10, which includes resistive strips 11 which are arranged next to one another and connect the first supply line segment 3A to the second supply line segment 3B. In one embodiment, the resistive strips 11 are arranged such that they are freely accessible on the surface after the production of the integrated circuit, and the resistive strips 11 may be embodied in a lower second metal layer MØ. For the resistive strips to be freely accessible in subsequent production processes, the lower metal layer MØ remains uncovered in the region of the resistor element 10, i.e., without a further layer being deposited thereon, so that selective resistive strips 11 can be severed, e.g., utilizing a laser trimming method. The respective resistance of the resistor element 10 can thereby be set accurately. The resistive strips 11 may be connected to the supply line segments 3A, 3B via contact points 12.

FIG. 3 illustrates a cross section through the region of the resistor element 10 illustrated in FIG. 2. As shown in FIG. 3, the first and second supply line segments 3A, 3B are connected through the plated-through (i.e., filled with metal) holes 13 and a further, third metal layer Ml to the lower, second metal layer MØ, in which the resistive strips 11 are embodied. In another embodiment, the supply line segments are embodied as a lower metal layer while the resistive strips are formed in an upper metal layer. For embodiments of the invention, the resistor element 10 may be provided with a set resistance or resistance that can be set, and the setting of the resistance may be set utilizing a laser trimming method and/or by means of some other known method, e.g., using a controlled transistor, an adjustable antifuse structure or the like.

What is claimed is:

1. An integrated circuit, comprising:
   one or more first output drivers and one or more second output drivers for driving signals from the integrated circuit;
   a first supply line segment connected to a first supply terminal to provide a supply voltage to the one or more first output drivers;
   a second supply line segment connected to a second supply terminal to provide the supply voltage to the one or more second output drivers; and
   a resistor connected between the first supply line segment and the second supply line segment, wherein at least one of the first and second supply line segments is disposed in a first interconnect layer of the integrated circuit and wherein the resistor is disposed in a second interconnect layer.

2. The integrated circuit of claim 1, wherein the resistor has a resistance value selected to reflect line disturbances on at least one of the first and second supply line segments.

3. The integrated circuit of claim 1, wherein the first supply line segment is otherwise not connected to the second supply line segment.

4. An integrated circuit, comprising:
one or more first output drivers and one or more second output drivers for driving signals from the integrated circuit;
a first supply line segment connected to a first supply terminal to provide a supply voltage to the one or more first output drivers;
a second supply line segment connected to a second supply terminal to provide the supply voltage to the one or more second output drivers; and
a resistor connected between the first supply line segment and the second supply line segment, wherein the resistor has a resistance value selected to reflect line disturbances on at least one of the first and second supply line segments and wherein the resistor comprises a plurality of resistive strips.

5. The integrated circuit of claim 4, wherein one or more resistive strips are selectably severable.

6. An integrated circuit, comprising:
a first output driver group having one or more first output drivers for driving signals from the integrated circuit;
a second output driver group having one or more second output drivers for driving signals from the integrated circuit;
a first supply line segment connected to a first supply terminal to provide a first supply voltage to the one or more first output drivers of the first output driver group;
a second supply line segment connected to a second supply terminal to provide the first supply voltage to the one or more second output drivers of the second output driver group;
a first resistor connected between the first supply line segment and the second supply line segment;
a third supply line segment connected to a third supply terminal to provide a second supply voltage to the one or more first output drivers of the first output driver group;
a fourth supply line segment connected to a fourth supply terminal to provide the second supply voltage to the one or more second output drivers of the second output driver group; and
a second resistor connected between the third supply line segment and the fourth supply line segment, wherein the first and second supply line segments are disposed in a first metal layer of the integrated circuit and wherein the first resistor is disposed in a second metal layer.

7. An integrated circuit, comprising:
a first output driver group having one or more first output drivers for driving signals from the integrated circuit;
a second output driver group having one or more second output drivers for driving signals from the integrated circuit;
a first supply line segment connected to a first supply terminal to provide a first supply voltage to the one or more first output drivers of the first output driver group;
a second supply line segment connected to a second supply terminal to provide the first supply voltage to the one or more second output drivers of the second output driver group;
a first resistor connected between the first supply line segment and the second supply line segment;
a third supply line segment connected to a third supply terminal to provide a second supply voltage to the one or more first output drivers of the first output driver group;
a fourth supply line segment connected to a fourth supply terminal to provide the second supply voltage to the one or more second output drivers of the second output driver group; and
a second resistor connected between the third supply line segment and the fourth supply line segment, wherein the first resistor has a first resistance value selected to reflect line disturbances on at least one of the first and second supply line segments and wherein the second resistor has a second resistance value selected to reflect line disturbances on at least one of the third and fourth supply line segments and wherein the first resistor comprises a first plurality of resistive strips and the second resistor comprises a second plurality of resistive strips.

8. The integrated circuit of claim 7, wherein one or more of the first and second pluralities of resistive strips are selectably severable.

9. An integrated circuit, comprising:
one or more first output driving means and one or more second output driving means for driving signals from the integrated circuit;
a first supply line connected to a first supply terminal means for providing a supply voltage to the one or more first output driving means;
a second supply line connected to a second supply terminal means for providing the supply voltage to the one or more second output driving means; and
a means for resisting connected between the first supply line and the second supply line, wherein at least one of the first and second supply lines is disposed in a first interconnect layer of the integrated circuit and wherein the means for resisting is disposed in a second interconnect layer.

10. The integrated circuit of claim 9, wherein the means for resisting has a resistance value selected to reflect line disturbances on at least one of the first and second supply line.

11. The integrated circuit of claim 9, wherein the first supply line is otherwise not connected to the second supply line.

12. An integrated circuit, comprising:
one or more first output driving means and one or more second output driving means for driving signals from the integrated circuit;
a first supply line connected to a first supply terminal means for providing a supply voltage to the one or more first output driving means;
a second supply line connected to a second supply terminal means for providing the supply voltage to the one or more second output driving means; and
a means for resisting connected between the first supply line and the second supply line, wherein the means for resisting has a resistance value selected to reflect line disturbances on at least one of the first and second supply lines, and wherein the means for resisting comprises a plurality of resistive strips.

13. The integrated circuit of claim 12, wherein one or more resistive strips are selectably severable.

* * * * *